United States Patent
Chang et al.

(10) Patent No.: US 6,273,099 B1
(45) Date of Patent: Aug. 14, 2001

(54) SIMPLIFIED METHOD FOR CLEANING SILICON WAFERS AFTER APPLICATION OF LASER MARKS

(75) Inventors: Chun Chieh Chang, Tainan; Kuo-Fong Chen; Jung-Hui Kao, both of Hsin-Chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/108,412

(22) Filed: Jul. 1, 1998

(51) Int. Cl.$^7$ ................. B08B 3/04; B08B 3/10
(52) U.S. Cl. ................. 134/1.3; 134/26; 134/2; 134/902; 134/29
(58) Field of Search ............... 134/1, 1.2, 2, 26, 134/29, 30, 34, 902, 1.3, 3

(56) References Cited

U.S. PATENT DOCUMENTS

| | | | |
|---|---|---|---|
| 5,000,208 | 3/1991 | Ludwig et al. | 134/58 |
| 5,069,235 | 12/1991 | Vetter et al. | 134/113 |
| 5,271,798 | * 12/1993 | Sandhu et al. | 156/638 |
| 5,352,328 | * 10/1994 | Obeng et al. | 156/646 |
| 5,589,422 | 12/1996 | Bhat | 437/228 |
| 5,604,153 | * 2/1997 | Tsubouchi et al. | 437/173 |
| 5,645,727 | * 7/1997 | Bhave et al. | 210/651 |
| 5,656,097 | * 8/1997 | Olesen et al. | 134/1 |
| 5,681,397 | 10/1997 | Li | 134/2 |
| 5,956,596 | * 9/1999 | Jang et al. | 438/401 |
| 6,063,695 | * 5/2000 | Lin et al. | 438/462 |
| 6,103,636 | * 8/2000 | Zahorik et al. | 438/745 |

OTHER PUBLICATIONS

Wong et al, Post–Acid Rinse Enhancement through Megasonic Quickdump Rinsing, FabTech 6th edition (section 6—Wafer Processing), ICG Publishing, Ltd., pp. 325–331. Feb. 1997.*
S. Wolf et al, "Silicon Processing for the VLSI Era–vol. 1", Lattice Press, Sunset Beach, CA, 1986, pp. 516–517.

* cited by examiner

*Primary Examiner*—Alexander Markoff
(74) *Attorney, Agent, or Firm*—George O. Saile; Stephen B. Ackerman

(57) ABSTRACT

A simplified cleaning method for the removal of particulates and adherent residues resulting from the incorporation of laser identification marks onto silicon wafers is described. The cleaning method consists of first immersing the wafers in a heated ammoniacal/hydrogen peroxide RCA-SC-1 cleaning solution in the presence of megasonic agitation. This is followed by a immersion rinse in de-ionized water heated to at least 50° C. Finally the wafers are subjected to at least three quick-dump rinses in room temperature de-ionized water and dried. It is found that the hot de-ionized water rinse provides adequate removal of chemical residues remaining after the particle dislodging action of the megasonically agitated RCA SC-1 solution to eliminate the need for application of the acidic/hydrogen peroxide RCA SC-2 treatment.

7 Claims, 2 Drawing Sheets

SIMPLIFIED METHOD FOR CLEANING SILICON WAFERS AFTER APPLICATION OF LASER MARKS

BACKGROUND OF THE INVENTION (1) Field of the Invention

The invention relates to processes for the manufacture of semiconductor devices and more particularly to processes related to wafer cleaning.

(2) Description of Previous Art

The fabrication of integrated circuits involves the forming of semiconductor devices within the surface of silicon wafers. The integrated circuits are located within discrete units identified as chips or dice. Each chip or die contains the devices and circuits which will constitute a discrete manufactured product. The dice are arranged in a fashion, on the wafer, to provide a maximum number of functional dice of final product. This organization is commonly identified by a wafer map.

During manufacture, the silicon wafers are subjected to a series of processing steps, some of which address multiple wafers at one time and others of which process the wafers one at a time. In order to effectively monitor the production line it is necessary to maintain a reliable system of wafer tracking. To this end laser identification marks are embedded on each wafer at the very beginning of the processing cycle. They contain information for later chip identification such as lot number and job number.

For some product designs, the laser marks are located in the saw kerf adjacent to the product dice. This means of identification allows in-process tracking of wafers by lot and job number. In other designs laser marks are provided on the chips themselves and can later be used to relate in-the-field chip failures to processing history. Such laser marks reflect not only wafer and lot number but can also indicate die location on the wafer.

The process of laser marking involves instantaneous violent local eruption of material from the surface of the wafer creating a widespread area of debris consisting of particulates and chemical residue which is visible as a diffuse discoloration in the vicinity of the laser marks after initial oxidation. It is imperative that these particulates and chemical residues be thoroughly removed from the wafers before further processing.

A method using $NH_4OH/H_2O_2$ and $HCL/H_2O_2$ solutions, commonly called RCA cleaning, has been used for cleaning particulates and other chemical residues from silicon wafers for many years. A discussion of the RCA technique may be found in Wolf, S. and Tauber, R. N., "Silicon Processing for the VLSI Era", Vol. 1, Lattice Press, Sunset Beach, Calif., (1986), p516ff. The first ammoniacal solution(SC-1), when used in concert with the application of ultrasonic or megasonic agitation, is effective for removing organic residues and particulates while the second acidic solution(SC-2) is effective in removing metallic contaminants. The abbreviations SC-1 and SC-2 are commonly used and refer to standard clean 1 and 2. A dilute HF treatment is often added between SC-1 and SC-2 to remove silicon oxide.

The RCA method may also be used to remove of residues left as a result of laser ablation during the formation of wafer identification marks. A current procedure applies SC-1 in a megasonic bath followed by three quick-dump rinses in un-heated DI (de-ionized) water. This is then followed by a dip in 1% HF followed by a second SC-1 and an SC-2 treatment. The megasonic SC-1 treatment is found to be effective in removing the particulates but chemical residues remain and must be removed by the SC-2 treatment.

Li, U.S. Pat. No. 5,681,397 teaches a method of rinsing and drying silicon wafers after their surfaces have been treated by aqueous HF. The method comprises immersing the wafers in a boiling hydrochloric acid solution and drawing the wafers out to dry in ambient air. Experiment found that the surface roughness is less with boiling HCL than with boiling water alone.

Ludwig, et.al., U.S. Pat. No. 5,000,208 describes an apparatus for rinsing and drying wafers but does not address hot water rinsing. Bhat, U.S. Pat. No. 5,589,422 describes a gas phase process for removing trace metals as well as thin surface layers from a semiconductor wafer. The process forms a thin oxide film which is then removed by gas phase etching. Vetter, U.S. Pat. No. 5,069,235 describes an apparatus for cleaning and rinsing wafers which features the capability to perform quick dumps and spray rinses.

SUMMARY OF THE INVENTION

It is an object of this invention to provide an improved method for cleaning silicon wafers.

It is another object of this invention to provide a cost effective method for cleaning wafers of particulate and chemical debris left after forming marks by laser ablation.

It is another object of this invention to provide a method for cleaning wafers of particulate and chemical debris left after forming marks by laser ablation which eliminates the hazardous use HF.

It is another object of this invention to provide an improved method for removing chemical residues left after megasonic cleaning of wafers in ammoniacal/hydrogen peroxide solutions.

It is another object of this invention to reduce chemical consumption and cleaning machine utilization and improve wafer throughput in a manufacturing line.

These objects are accomplished by first subjecting the wafers to a cleaning bath containing a heated RCA SC-1 ammoniacal/peroxide solution under megasonic agitation, followed by a rinse in heated Dl water. The temperature of the Di water must be greater than 50° C. Thereafter three room temperature (25° C.) DI water quick-dump rinses are performed followed by spin drying. The incorporation of the hot DI water rinse eliminates the need for treatment with the second RCA acidic/peroxide solution and thereby affords considerable cost savings in terms of chemical usage and disposal as well as equipment time. The need for HF is eliminated from the process, thereby greatly improving safety.

DESCRIPTION OF THE PREFERRED EMBODIMENTS

Figure 1:
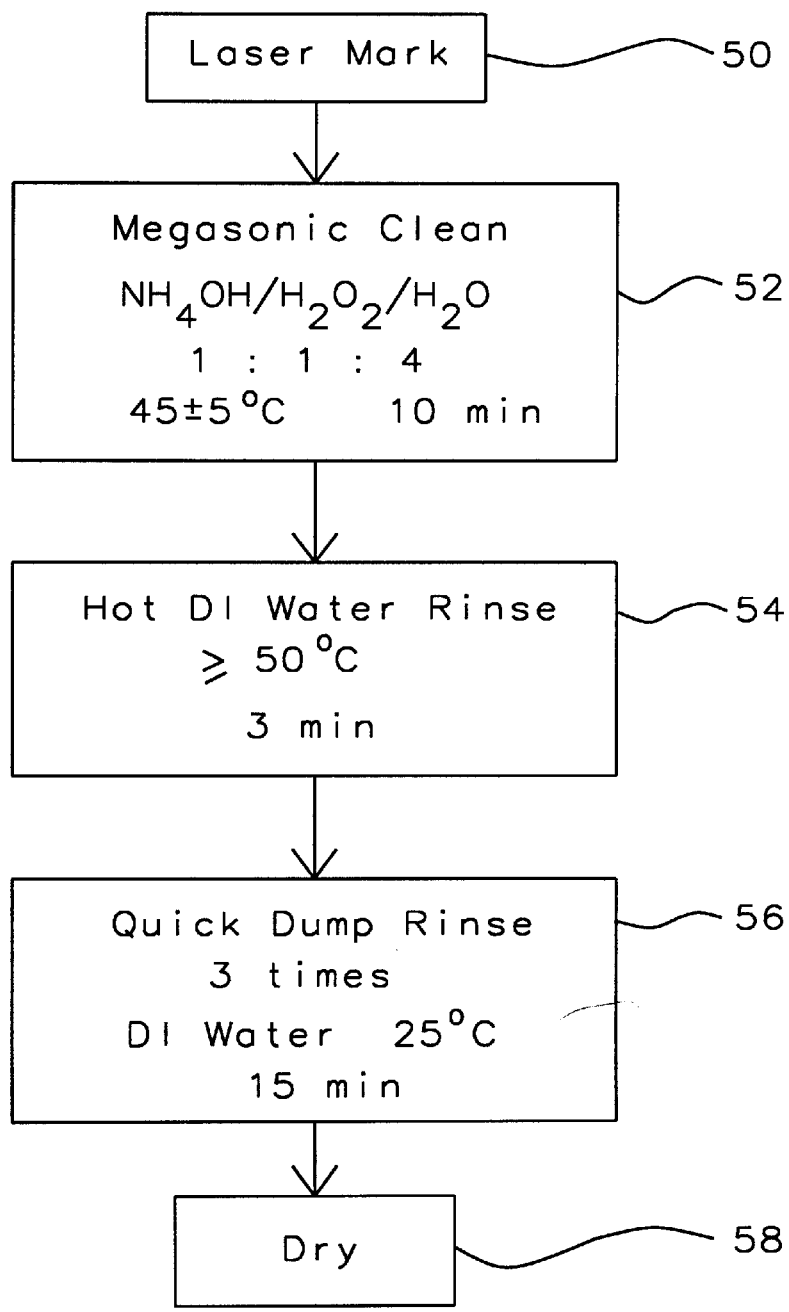
FIG. 1 is a flow chart showing the process steps of the current invention.

Accordingly, one or more single-crystalline silicon wafers are provided. A flow chart illustrating the procedure of the invention is shown in FIG. 1 and will be referred to in the discussion of the embodiment. The wafers are successively mounted on the stage of a laser marking tool and identification or other marks are formed on the polished surfaces of the wafers by laser ablation of the wafer surface 50(FIG. 1). The procedures for the placement of laser marks on silicon wafers is well known and is widely practiced to provide means for wafer and chip identification for the purpose of process monitoring and subsequent failure or performance analysis.

The laser ablation causes the eruption and scattering of material from the wafer which then distributes over the wafer surface as particulate debris and chemical residue which may consist of products of the reaction of the molten wafer material with ambient gases. Much of this debris and residue remains adherent on the wafer and can not be removed by conventional mechanical means such as blowing air or brushing.

The marked wafers are next placed in a tank containing a heated solution of about one part by volume semiconductor grade $NH_4OH$(29%), one part semiconductor grade $H_2O_2$ (30%) and four parts by volume of de-ionized water 52(FIG. 1). This solution is well known as RCA standard cleaning solution number one (SC-1) and is widely used for the removal of organic material and particulates from semiconductor wafers. The solution is heated in the tank to a temperature of between about 40 and 50° C. It is important not to overheat the solution because the $H_2O_2$ rapidly deteriorates at temperatures above about 80° C. Particle dislodgement is further encouraged and aided by the application of megasonic energy to the solution by means of a piezoelectric transducer fitted to the tank. Megasonic cleaning tanks are commercially available from, for example, FSI International, Inc. in Chaska, Minn.(USA), or Verteq Process Systems, in Santa Ana, Calif.(USA). For ease of handling, a rack is provided into which the one or more wafers may be loaded. The wafers may then easily be raised and lowered into the cleaning tank.

Figure 2:
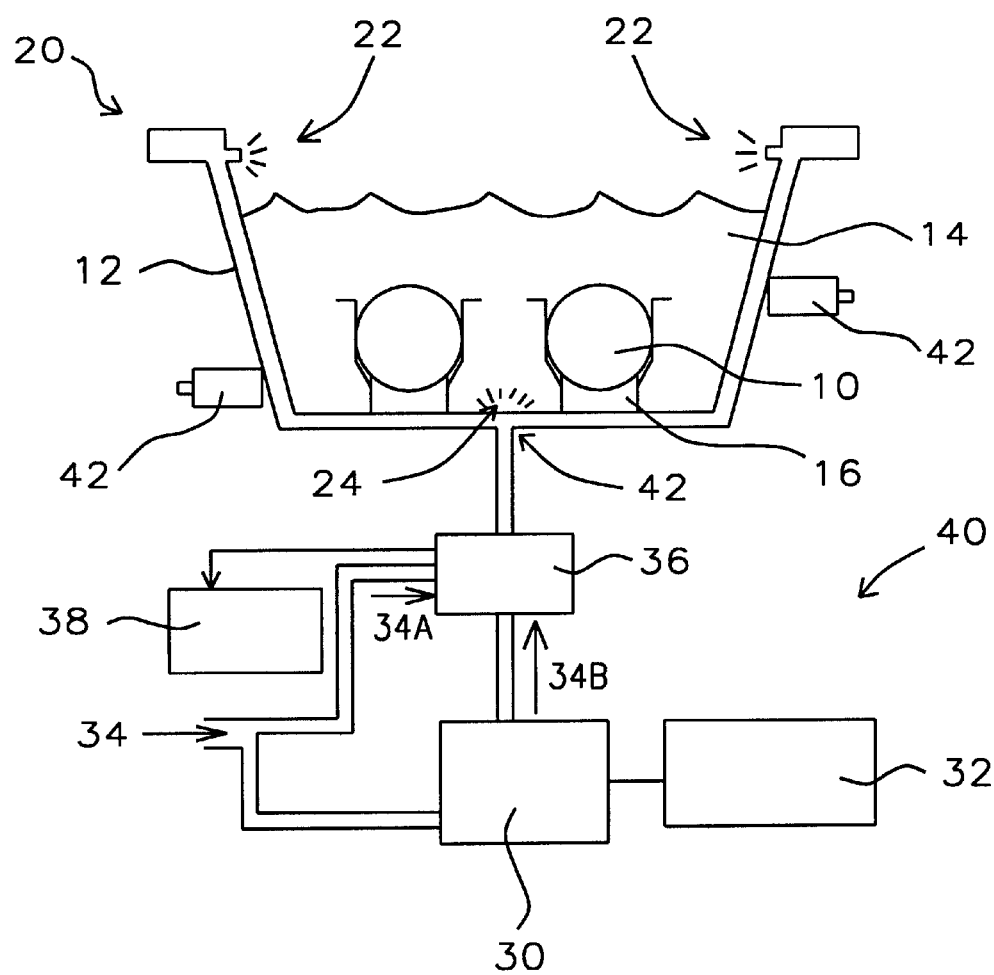
FIG. 2 is a cross section of a rinse tank fitted with the capability to apply heater rinse water to wafers in accordance to the teaching of this invention.

After treatment in the RCA SC-1 solution, the wafers are transferred by means of the rack, into a rinse tank wherein they receive a hot water rinse 54(FIG. 1). FIG. 2 shows a cross section of a rinse 20 suitable for performing the hot water rinse. Also shown in FIG. 2 is the positioning of the wafers 10 and the wafer rack 16 within the rinse tank 20. The rinse tank 20 is preferably a quick dump rinse tank which is fitted with doors(not shown) in the bottom of the tank which can be quickly opened to discharge the rinse liquid. Quick-dump rinsing is a well know procedure which has been found beneficial in many cleaning applications. Quick-dump rinsing equipment is commercially available.

A water delivery system 40 is provided with a regulated flow of DI water 34. A portion of the flow 34B is passed through a heater and delivered to a pneumatically operated mixing valve 36 where it is mixed with a non-heated portion of the DI water flow 34A. The combined flow then passes into the base of the rinse tank 20 through a port 42. The walls 12 of the rinse tank 20 are channeled and allow passage of the temperature regulated water to delivery ports 24 in the base of the tank as well as spray ports 22 at the top of the tank and above the level of the liquid 14. Temperature sensors 42 attached to the walls of the tank 20 provide signals to a heater controller 32 which controls power to the heating element in the heater unit 30.

The temperature of the rinse water in the tank 20 is regulated to between about 50 and 60° C. and the wafer rack 16 with the wafers 10 are immersed in the hot water 14 for a period of between about 2 and 5 minutes. A higher water temperature may be used if desired but is not necessary to effect proper removal of the laser residues. The valve controller 38 may be manually set, either to deliver only the heated flow 34B during the hot water rinse procedure 54(FIG. 1) or to mix in a portion of the un-heated flow 34A. The setting of the valve 36 is determined by experiment to provide optimum temperature control.

After the hot water rinse, the hot water is dumped and the wafers are rinsed at least three times with room temperature (25° C.) DI water 56(FIG. 1) using a quick-dump procedure. The valve controller 38 is set to deliver only the un-heated water flow 34A. The quick-dump rinses are performed by filling the tank to cover the wafers and then opening the doors(not shown) at the bottom of the tank to quickly dump the water. After the quick-dump rinsing is completed the wafers removed and spun dry.

Fitting a quick-dump rinse tank with a water heating and temperature control system as described permits the hot water rinse and the three cold water quick-dump rinses to be performed successively in the same apparatus. This is cost effective by eliminating the requirement of a second rinse tank but more importantly, eliminates the transfer of the wafers from the hot water rinse tank to the quick-dump tank.

Alternatively, the hot water rinse may be performed in a separate rinse tank and the wafers thereafter transferred to a quick-dump rinse tank for the cold water rinses.

The embodiment described uses silicon wafers. It should be well understood by those skilled in the art that other substrates may also be used. While the invention has been particularly shown and described with reference to the preferred embodiments thereof, it will be understood by those skilled in the art that various changes in form and details may be made without departing from the spirit and scope of the invention.

What is claimed is:

1. A method for cleaning a silicon wafer after the formation of laser marks on said wafer, that features processing without the use of HF or hydrochloric acid/hydrogen peroxide solution comprising:
    (a) providing a silicon wafer;
    (b) forming marks on said wafer;
    (c) subjecting said wafer to a cleaning solution containing ammonium hydroxide, hydrogen peroxide, and water for a first time period and whereby said solution is agitated by megasonic energy;
    (d) after said cleaning, transferring said wafer into a quick dump rinse tank and rinsing said wafer with a rinsant consisting of de-ionized water heated to a temperature of at least 50° C. for a second time period;
    (e) performing at least three quick-dump rinses of said wafer in de-ionized water; and
    (f) drying said wafer.

2. The method of claim 1 wherein said marks are applied at chip locations on said wafer.

3. The method of claim 1 wherein said first time period is between about 8 and 12 minutes.

4. The method of claim 1 wherein said second time period is between about 2 and 5 minutes.

5. The method of claim 1 wherein said quick-dump rinse tank is fitted with means to deliver heated rinsant.

6. The method of claim 5 wherein said rinsing and said at least three quick-dump rinses are performed successively in said quick-dump rinse tank.

7. The method of claim 1 wherein said at least three quick-dump rinses are performed with room temperature (25° C.) de-ionized water.

* * * * *